(12) United States Patent
Edmunds et al.

(10) Patent No.: US 11,071,238 B2
(45) Date of Patent: Jul. 20, 2021

(54) FLUID COOLING SYSTEM

(71) Applicant: ICEOTOPE LIMITED, St Peter Port (GG)

(72) Inventors: Neil Edmunds, South Yorkshire (GB); Andrew Young, South Yorkshire (GB); David Amos, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 130 days.

(21) Appl. No.: 16/463,948

(22) PCT Filed: Nov. 27, 2017

(86) PCT No.: PCT/GB2017/053556
§ 371 (c)(1),
(2) Date: May 24, 2019

(87) PCT Pub. No.: WO2018/096362
PCT Pub. Date: May 31, 2018

(65) Prior Publication Data
US 2020/0390007 A1    Dec. 10, 2020

(30) Foreign Application Priority Data
Nov. 25, 2016  (GB) .................... 1619987

(51) Int. Cl.
*H05K 7/20* (2006.01)
*H01L 23/473* (2006.01)

(52) U.S. Cl.
CPC ..... *H05K 7/20809* (2013.01); *H01L 23/4735* (2013.01); *H05K 7/203* (2013.01);
(Continued)

(58) Field of Classification Search
CPC .......... H05K 7/20236; H05K 7/20272; H05K 7/203; H05K 7/20327; H05K 7/20772; H05K 7/20809; H01L 23/4735
See application file for complete search history.

(56) References Cited

U.S. PATENT DOCUMENTS

| 3,609,991 A | 10/1971 | Chu | |
| 5,907,473 A * | 5/1999 | Przilas | ............... H05K 7/20345 361/699 |

(Continued)

FOREIGN PATENT DOCUMENTS

| CN | 1813506 A | 8/2006 |
| CN | 102461357 A | 5/2012 |

(Continued)

OTHER PUBLICATIONS

International Search Report and Written Opinion for Application No. PCT/GB2017/053556, dated Feb. 21, 2018, 12 pages.

(Continued)

*Primary Examiner* — Robert J Hoffberg
(74) *Attorney, Agent, or Firm* — Butzel Long

(57) ABSTRACT

An apparatus for cooling one or more heat generating components comprises: a sealable enclosure defining a volume for containing a first coolant and one or more heat generating components; a conduit surrounded by the volume, the conduit enabling a second coolant to enter and leave the enclosure, the conduit providing a fluid-tight seal between the first coolant and the second coolant when the first coolant within the volume surrounds the conduit; and a pump within the enclosure configured to direct the first coolant to the conduit such that heat is exchanged between the first coolant and the second coolant.

24 Claims, 15 Drawing Sheets

(52) U.S. Cl.
CPC ..... H05K 7/20236 (2013.01); H05K 7/20272 (2013.01); H05K 7/20327 (2013.01)

(56) References Cited

U.S. PATENT DOCUMENTS

| | | | | |
|---|---|---|---|---|
| 6,955,062 | B2* | 10/2005 | Tilton | F28D 5/00 257/E23.1 |
| 7,299,647 | B2* | 11/2007 | Tilton | F28D 5/00 257/E23.1 |
| 7,403,392 | B2* | 7/2008 | Attlesey | G06F 1/20 361/699 |
| 7,414,845 | B2* | 8/2008 | Attlesey | G06F 1/185 361/699 |
| 7,724,517 | B2* | 5/2010 | Attlesey | G06F 1/20 361/679.53 |
| 7,885,070 | B2* | 2/2011 | Campbell | H05K 7/20809 361/699 |
| 7,911,782 | B2* | 3/2011 | Attlesey | H05K 7/20345 361/679.53 |
| 8,009,419 | B2* | 8/2011 | Attlesey | H05K 7/20263 361/679.53 |
| 8,014,150 | B2 | 9/2011 | Campbell | |
| 8,305,759 | B2* | 11/2012 | Attlesey | H05K 7/20772 361/701 |
| 8,467,189 | B2 | 6/2013 | Attlesey | |
| 10,609,839 | B1* | 3/2020 | Archer | H05K 7/20236 |
| 2002/0186538 | A1 | 12/2002 | Kase | |
| 2007/0023169 | A1 | 2/2007 | Mahalingam | |
| 2008/0169086 | A1 | 7/2008 | Hu | |
| 2008/0173427 | A1 | 7/2008 | Schumacher | |
| 2010/0118494 | A1 | 5/2010 | Campbell | |
| 2014/0123492 | A1 | 5/2014 | Campbell | |
| 2014/0352928 | A1 | 12/2014 | Huang | |
| 2020/0305307 | A1* | 9/2020 | Amos | H05K 7/20772 |

FOREIGN PATENT DOCUMENTS

| | | | |
|---|---|---|---|
| CN | 102625639 A | 8/2012 | |
| CN | 105042949 A | 11/2015 | |
| CN | 205175190 U | 4/2016 | |
| CN | 105981486 A | 9/2016 | |
| JP | 2001077571 A | 3/2001 | |
| WO | WO-9743887 A1 * | 11/1997 | ......... H05K 7/20345 |
| WO | 2014007673 A1 | 1/2014 | |

OTHER PUBLICATIONS

UK Search Report for Application No. GB1619987.9, dated Mar. 13, 2017, 3 pages.
European Examination Report dated Mar. 23, 2021 issued in EP Application No. 17805251.0.

* cited by examiner

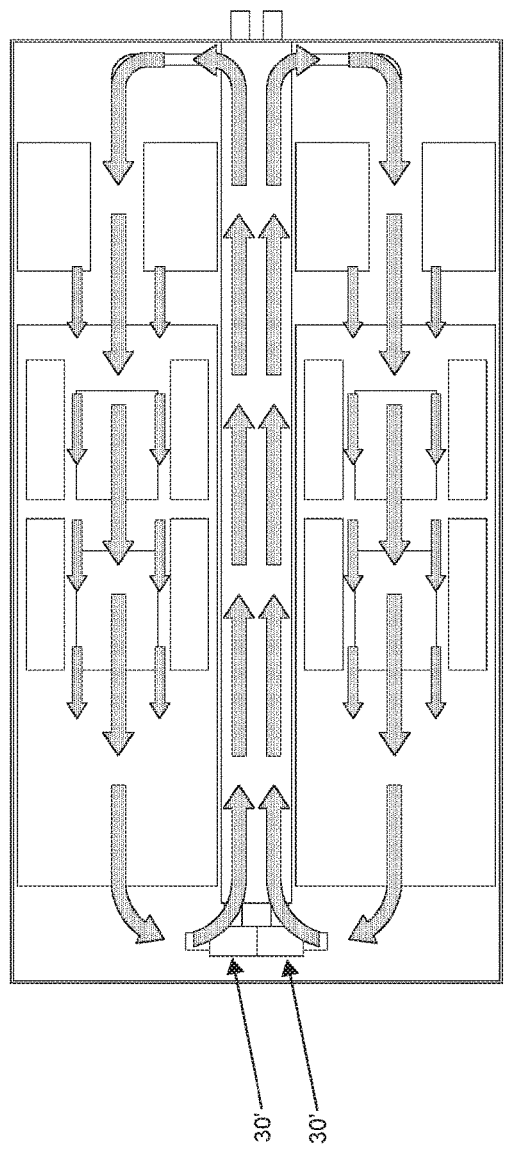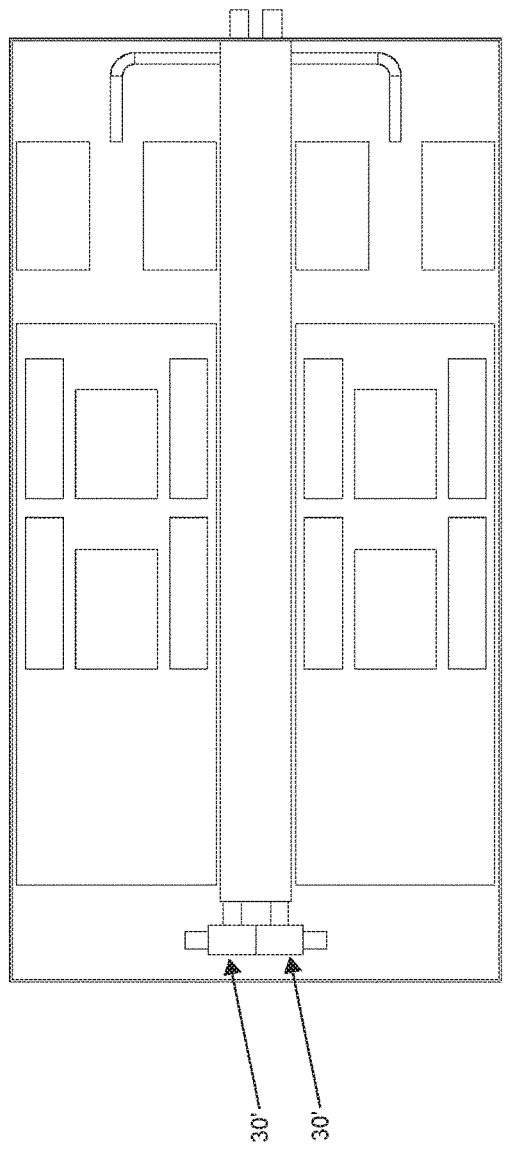
Figure 10
Figure 11

FLUID COOLING SYSTEM

FIELD OF THE INVENTION

The present invention relates to a cooling system and in particular, a cooling system for electronic devices and boards. The cooling system may provide a sealed enclosure for housing heat generating components such as motherboards, memory modules or servers that require active or fluid cooling.

BACKGROUND OF THE INVENTION

Many types of electrical component generate heat during operation. In particular, electrical computer components such as motherboards, central processing units (CPUs) and memory modules may dissipate substantial amounts of heat when in use. Heating of the electrical components to high temperatures can cause damage, affect performance or cause a safety hazard. Accordingly, substantial efforts have been undertaken to find efficient, high performance systems for cooling electrical components effectively and safely.

One type of cooling system uses liquid cooling. Although different liquid cooling assemblies have been demonstrated, in general the electrical components are immersed in a coolant liquid so as to provide a large surface area for heat exchange between the heat generating electrical components and the coolant.

U.S. Pat. No. 8,467,189 describes a liquid submersion cooling system that cools a number of electronic devices within a plurality of cases connected to a rack system. A housing is filled with a dielectric cooling liquid with heat generating electronic components submerged in the dielectric cooling liquids. The rack system contains a manifold that allows liquid transfer for multiple cases and a pump system for pumping the dielectric cooling liquid into and out of the rack. External heat exchangers allow the heated dielectric cooling liquid to be cooled before being returned to the rack. However, this requires a significant quantity of dielectric cooling fluid to be pumped into and out of each case in the rack. Furthermore, it is difficult to effectively direct or focus the cooling fluid within each case, which may contain different heat generating components, each having their own cooling requirements.

U.S. Pat. No. 8,014,150 describes the cooling of electronic modules in which a cooling apparatus is coupled to a substrate to form a sealed component around an electronic device. Pumps are located within the sealed compartment so that dielectric fluid is pumped towards the electronic device. Cooling occurs by changing the phase of the dielectric fluid from liquid to vapour, which then is caused to condense as it rises towards a liquid-cooled cold plate that is fed by a second fluid. However, this cooling system requires high pressure seals and multiple cooling compartments within a case and so relatively complicated plumbing arrangements for the second cooling fluid.

Therefore, there is required a method and system that overcomes these problems.

SUMMARY OF THE INVENTION

In accordance with a first aspect there is provided an apparatus for cooling one or more heat generating components. The apparatus for cooling one or more heat generating components comprises:

a sealable enclosure, tank or case defining a volume for containing a first (or primary) coolant and one or more heat generating components (e.g. electronic components);

a conduit or tube surrounded by the volume, the conduit enabling a second (or secondary) coolant to enter and leave the enclosure, the conduit providing a fluid-tight seal between the first coolant and the second coolant (especially) when the first coolant within the volume surrounds the conduit; and a pump (or at least one pump) within the enclosure configured to draw, pump, force or direct the first coolant to the conduit such that heat is exchanged between the first coolant and the second coolant. The pump within the enclosure enables the first coolant to be directed more effectively at the hot spots or specific heat generating regions within the enclosure. Having an internally circulating primary coolant means that it is easier to seal the system. The secondary coolant entering into the enclosure provides a more efficient heat transfer between the primary and secondary coolants. This combination of features provides a more effective cooling system that can be operated more reliably. The sealable enclosure may be sealed with a lid or hatch. This may be removable to allow access to internally located heat generating components or boards. The lid and other parts of the enclosure may incorporate one or more gaskets or seals and may be hinged or fully removed. Fixings, such as clamps, screws, latches or clasps may securely close the enclosure. The sealable or sealed enclosure may be rack-mounted, for example. The enclosure may be a module for housing electronic components, such as processors, motherboards, servers, memory modules or computer equipment.

In accordance with a second aspect there is provided a cooling module or apparatus used to cool one or more heat generating components (e.g. a motherboard). The cooling module comprises an enclosure that is sealable or sealed and contains a volume or void that may be filled or partially filled with a first coolant or fluid. The first coolant stays within the volume (that also contains the component or components to be cooled) and is circulated by one or more pumps. A separate cooling circuit, incorporating a second coolant (that is kept separate from the first coolant), enables heat to be removed from the module. The second coolant may enter the module, exchange heat with the first coolant and then leave the module. The second coolant may itself be cooled before returning to the module.

In accordance with a third aspect, there is provided a cooling module or apparatus used to cool one or more heat generating components (e.g. a motherboard). The cooling module comprises an enclosure that is sealable or sealed and contains a volume or void that may be filled or partially filled with a coolant or fluid. The coolant stays within the volume (that also contains the component or components to be cooled) and is circulated by one or more pumps. The coolant is directed over a plurality of hot areas or hot spots (two or more) that form from the one or more heat generating components. Preferably, separate pumps direct streams or jets of coolant over the hot spots within the module. Cool (or relatively cool) coolant may be pumped over the hotspots. The coolant may be cooled and drawn back in to the pump for recirculation. This may be used with or without the secondary coolant.

In accordance with a third aspect, there is provided a heat exchanger formed from a channel or duct having an inlet for receiving a first fluid or coolant, which leaves the channel by an outlet. A second fluid or coolant passes through a pipe, channel or conduit within the channel. At least some if not most of the flow of the first fluid is parallel with at least some if not most of the flow of the second fluid within the conduit. Heat may be exchanged between the first fluid and the second fluid. The conduit may be u-shaped, for example. Preferably, the heat exchanger operates within a module housing heat generating components. Preferably, the first fluid remains within an enclosure or housing of the module, whilst the second fluid enters and leaves the module without allowing it to mix with the first fluid.

A number of optional, preferable and/or advantageous aspects are now described with reference to many if not all aspects disclosed herein. Preferably, the pump may be further configured to direct the first coolant towards the one or more heat generating components. This may include one or more nozzles or vents to adjust the direction, speed, rate, pressure, width and/or height of flow of the first coolant within the enclosure. The pump may be provided upstream from the location of the conduit. Then, it may draw the first coolant towards the conduit, where heat is transferred away from the first coolant and cause the cooled first coolant to flow to (and preferably be directed at) the one or more heat generating components.

Preferably, the pump may be configured provide the first coolant with a horizontal flow. In other words, the first coolant may be directed in a single plane around the enclosure, tank or case. This may be parallel to a floor or base of the enclosure and/or in the direction of the flow of the second coolant into and out of the enclosure.

In embodiments, the apparatus may further comprise a channel arranged proximal, close to, adjacent, coaxial, around, enclosing or side-by-side with the conduit, the channel having an inlet for receiving the first coolant into the channel and an outlet for expelling the first coolant from the channel after exchanging heat with the second coolant. This provides a more efficient exchange of heat from the first coolant to the second coolant within a heat exchanger.

Preferably, the conduit is located within the channel. This allows the first coolant to be forced into close proximity with the second coolant when the first coolant is at its highest temperature in the cycle. This increases the cooling efficiency of the heat exchanger.

Optionally, the channel may have a box profile. The channel may be formed from metal, for example.

Preferably, the pump may be in fluid communication with the inlet to the channel or the outlet of the channel. These components may be linked by an enclosed pipe or channel, for example.

Optionally, the pump may be configured to direct the first coolant parallel or substantially parallel to the flow of the second coolant within the conduit. This keeps the first and second coolants in closer proximity improving heat transfer.

Optionally, the conduit (or pipe) may be u-shaped (e.g. having two straight sides linked by a bend). This may be a pipe or tube bent in the middle, e.g. at 180 degrees. Other configurations and sizes of the conduit may be used.

Preferably, the enclosure may further comprise an inlet and an outlet for the second coolant. The inlet and outlet are sealed against the enclosure to prevent the first and second coolants from mixing. The inlet and outlet pass through a wall or side of the case, enclosure or tank.

Optionally, the inlet and the outlet for the second coolant may be adjacent. This makes it easier to connect the inlet and outlet to a system for circulating the second coolant. The inlet and outlet may include removable connectors and/or flexible hoses.

Optionally, the inlet and the outlet for the second coolant may be located adjacent to the pump. Alternatively, the inlet and the outlet for the second coolant may be located adjacent to the conduit.

Optionally, the apparatus may further comprise one or more heat sinks in heat communication with the one or more heat generating components. This improves the heat conduction between the heat generating components and the first coolant. The heat sinks may be metal, for example.

The enclosure may have a rectangular or square cross section, for example.

Preferably, the one or more heat sinks may have fins arranged parallel to the flow of the first coolant. This reduces disruption in the flow of the first coolant within the enclosure and improves the rate at which heat is removed from heat generating components.

Optionally, the enclosure may further arranged to house one or more power supplies within the volume. Therefore, the power supplies may also be cooled by the first coolant. The power supplies may include external power connectors that pass through the enclosure. The power connectors may be sealed against leakage of the coolants.

Optionally, the apparatus may further comprise a second pump. Further pumps may also be included. Two pumps allow the first coolant to circulate in different directions further improving the rate at which heat may be removed.

Optionally, the first pump and the second pump may be arranged either side of the conduit. Other configurations may be used. The pumps may be in the same plane.

In some embodiments, the conduit forms part of a heat exchanger unit. Then, a pipe may be configured to direct the first coolant to the heat exchanger unit. The heat exchanger unit may comprise the channel arranged proximal, close to, adjacent, coaxial, around, enclosing or side-by-side with the conduit. The channel inlet may be coupled to the pipe. A second pipe may be coupled to the channel outlet for directing the (cooled) first coolant to the at least one heat generating component. The pump is (or pumps are) preferably provided upstream from the heat exchanger unit (but might be provided downstream from the heat exchanger unit in some embodiments.

Optionally, the heat exchanger unit further comprises a housing surrounding the conduit. Then, the housing may have an inlet for first coolant to flow through the heat exchanger unit. The heat exchanger unit is preferably positioned at an edge of the volume within the sealable enclosure.

Preferably, the at least one heat generating component is immersed in the first coolant. The first coolant can fill the enclosure with no air gaps.

Preferably, the first coolant is a liquid (at room temperature). Preferably, the first coolant is a one phase coolant. In other words, the first coolant may remain in the liquid phase at all stages of its cycle around the enclosure. The apparatus may be advantageously configured to maintain the first coolant in the one phase.

Optionally, the first coolant may be a two phase coolant. With such a coolant, the liquid may turn to vapour or gas when it contacts a heat generating component. The first coolant may then condense when it is cooled within the channel or heat exchanger.

Preferably, the second coolant is water or water based. This provides a safer and more efficient coolant that circulates outside of the enclosure. The secondary coolant may be water based and contain water and other additives. These may include one or more corrosion inhibitors and/or biogrowth inhibitors. For example, this may be a mix of 33% (+/−10%) glycol (by volume) in demineralised water.

The heat generating component may be any type of electrical component and in particular may be a computer component. For example, the heat generating electrical component may form part of a CPU or be used for data storage. There may be more than one heat generating electrical component mounted within the cooling module, and reference to "a" heat generating electrical component herein should be interpreted to mean "at least one" heat generating electrical component.

The volume of the sealable enclosure may be defined by a container (such as a tank or tray). The container is preferably arranged to house the first coolant and one or more heat generating components. Then, the sealable enclosure may be arranged so as to prevent the first coolant from leaving the container once the sealable enclosure is sealed. In other words, the first coolant may be sealed within the container, which has no inlet or outlet for the first coolant to leave the container. Heat exchange between the first coolant (in the volume) and the second coolant (in the conduit) takes place entirely within the sealable enclosure (that is, the container).

There are a number of benefits in having the first coolant contained (entirely) within the sealable enclosure. Firstly, the pressure of the first coolant may be reduced, because it does not leave the container (which would direct it towards to a rank or cabinet infrastructure outside the apparatus). The first coolant loop may thereby be provided entirely within the container. This makes the first coolant loop smaller than would otherwise be required (if the first coolant was directed outside the container) and requires fewer valves, connectors and other configurable parts through which the first coolant may need to flow. This reduces any pressure drop and therefore the resultant operating pressure.

Secondly, containing the first coolant loop and pump within the sealable enclosure means that the flow rate is individually controlled in each container. If the pump is external to the sealable enclosure (that is, the container), such as in a rack or cabinet infrastructure with multiple such sealable enclosures, a single pump or primary coolant loop may need to balance flow over each sealable enclosure. This is potentially very difficult to control.

A third issue in providing the first coolant (and any part of the first coolant loop) outside of the sealable enclosure (such as in the cabinet infrastructure) is that any failure (such as blockage, pump failure or leak) affects all of the individual sealable enclosures. Maintaining the first coolant within the sealable enclosure (container) may avoid these issues.

Any of these aspects or individual features of these aspects may be used together or in any combination. For example, the heat exchanger may be used with any of the cooling modules or apparatuses.

BRIEF DESCRIPTION OF THE FIGURES

The present invention may be put into practice in a number of ways and embodiments will now be described by way of example only and with reference to the accompanying drawings, in which:

FIG. 10 shows a plan view of the further example cooling system of FIGS. 8A and 8B, including an indication of the flow of a primary coolant;

FIG. 11 shows a plan view of the further example cooling system of FIGS. 8A and 8B;

It should be noted that the figures are illustrated for simplicity and are not necessarily drawn to scale. Like features are provided with the same reference numerals.

DETAILED DESCRIPTION OF THE PREFERRED EMBODIMENTS

The following figures illustrate various aspects and features of a cooling system 5 that may be used with one or more heat generating components. The cooling system 5 shown in FIGS. 1 to 7 may be used within a rack or shelving mounting system but other configurations may be used, including use as a stand-alone system. The cooling system 5 may take the form, or dimensions of a blade server, such as a one rack unit 19 inch blade (19×1.75 inch or 480 mm×44 mm), for example. Other sizes and racks may be used.

Figure 1:
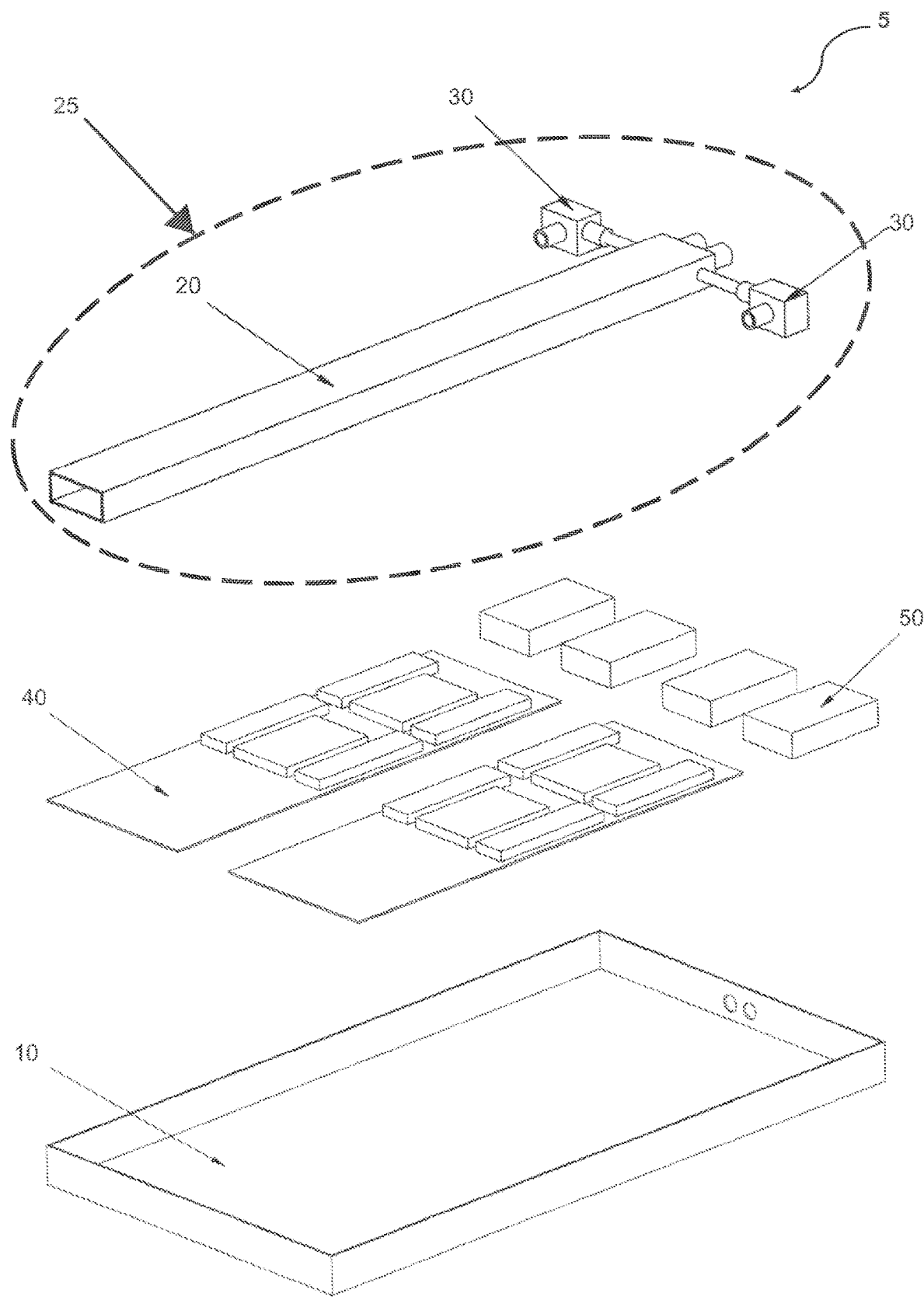
FIG. 1 shows an exploded view of an example cooling system for heat generating components according to a first embodiment, the cooling system including a heat exchanger system.

FIG. 1 shows an exploded view of some of the components of the cooling system 5. Not all components are shown in this figure, which is in schematic form illustrating the general layout for simplicity.

A rectangular coolant enclosure, tank, case or tray 10 defining a volume that may be filled with a first or primary coolant, which is preferably a dielectric fluid. This coolant tank is water, gas and/or fluid tight and leak-proof. Dotted line 25 encloses a set of components that both cool and circulate the first coolant. These components include a heat exchanger 20 and a pair of pumps 30. The heat exchanger 20 cools the primary coolant using a second or secondary coolant. The pumps 30 draw the primary coolant through the heat exchanger 20 and around the tank 10. This example shows two pumps but a single pump (or more than two pumps) may also be used. This pump or pumps are located within the tank 10.

In this configuration two motherboards 40 are shown. This layout may match the footprint of a 1U 19" blade. Components on the motherboards 40 include heat generating components that require cooling. Other components 50 are shown schematically in FIG. 1. These other components may include power supplies, for example. These other components 50 are shown at one end (i.e. a rear end) of the tank 10. The rear end may be the end of the tray 10, where electrical connectors are mounted. This makes it easier to make electrical and power connections to these other components 50 as connectors (not shown in this figure) may be provided at the same end of the tank 10.

Figure 2:
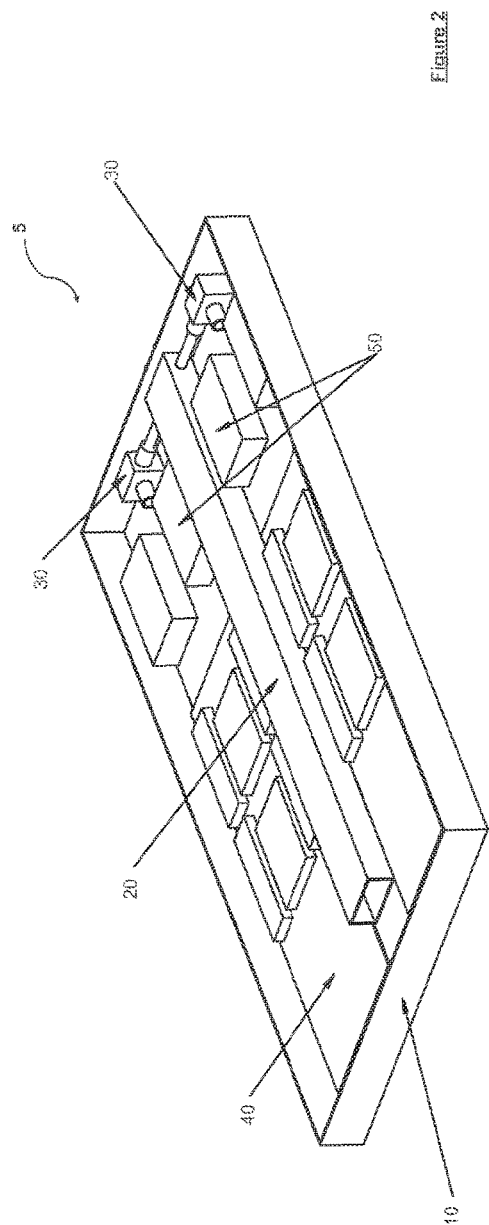
FIG. 2 shows a perspective view of the cooling system of FIG. 1.
Figure 3:
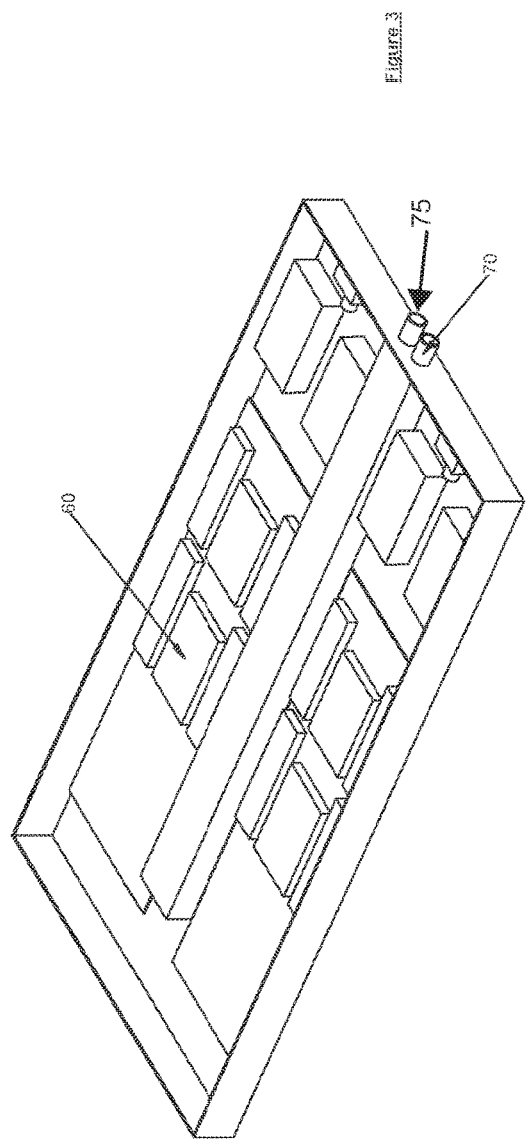
FIG. 3 shows a further perspective view of the cooling system of FIG. 1 rotated by 90 degrees.

FIG. 2 shows a schematic diagram of the same components of the cooling system 5 shown in FIG. 1 but located in assembled form within the tank 10. The components are substantially arranged in the same plane. FIG. 3 shows the cooling system 5, rotated by 90 degrees. An inlet port 70 and outlet port 75 are shown either side of a centre line (i.e. a long axis) of the tank 10. These ports 70, 75 allow the secondary coolant to enter and exit the tank 10. While the secondary coolant is within the tank it flows through the heat exchanger within a conduit such as a pipe or tube (not shown). Preferably, the conduit is formed from a good heat conductor such as a metal so that heat may be easily exchanged between the primary coolant and the secondary coolant, which is maintained or cooled to a temperature below that of the primary coolant drawn into the heat exchanger. This cooled primary coolant is directed over one or more temperature generating components 60 on the motherboard 40. Examples of high temperature components are processors and memory although other components may also be placed on the motherboard 40 and cooled.

The flow of the primary coolant may be customised to suit different high temperature component positions and configurations. Heat sinks (not shown in this figure) may also be located on or near to heat generating components 60. The heat sinks on the heat generating components may have fins or baffles that are placed parallel to the flow of the primary coolant to improve circulation.

Figure 4:
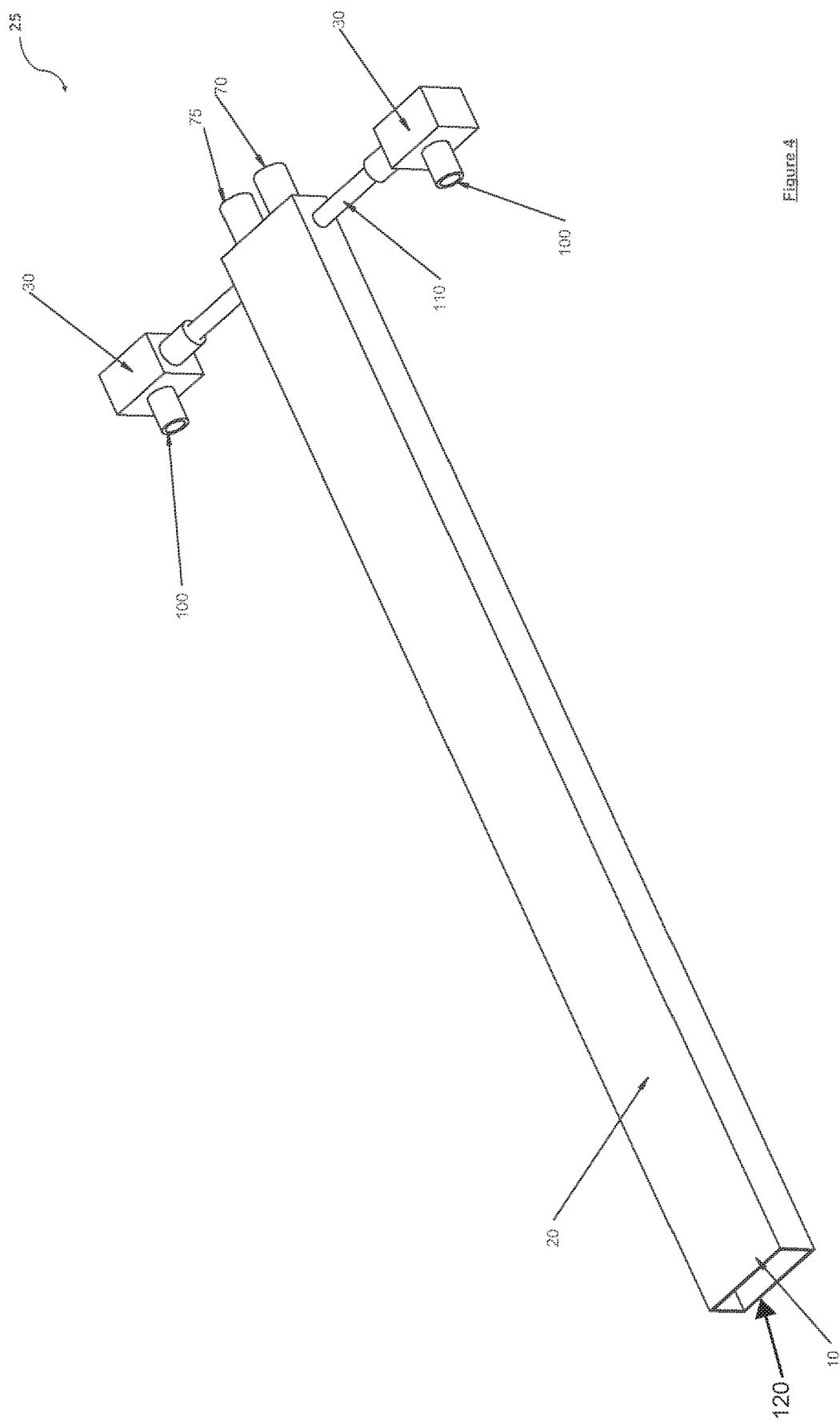
FIG. 4 shows a perspective view of the heat exchanger of the cooling system of FIG. 1.

FIG. 4 shows in greater detail the set of components or heat exchanger system 25 that both cools and circulates the first coolant. Pumps 30 (e.g. impeller pumps) draw, direct or suck the primary coolant in to the heat exchanger 20 through an aperture or void 120 at one end. The primary coolant is forced or flows along a channel or duct where it surrounds the conduit that contains the cooler secondary coolant. The primary coolant flows along connector or pump pipes 110, which connect the channel to the pumps 30.

The connector pipes 110 take the primary coolant from the heat exchanger 20 to the pumps 30. The pumps are configured to draw equal amounts of coolant on each side. As there are no gaps in the connector pipes 110 then the primary coolant is pulled through the connector pipes 110 and heat exchanger 20 by the pumps 30. In this example two pumps 30 are used but different number of pumps may also be used.

The primary coolant is pumped out of nozzles 100 towards the heat generating components (not shown in this figure). As the primary coolant travels through the channel it comes into contact with the conduit or tube carrying the cooler secondary coolant. This cools the primary coolant. The channel forces the primary coolant against the secondary coolant conduit ensuring that more coolant comes into contact, which increases the rate (and efficiency) at which the primary coolant is cooled.

The heat exchanger system 25 exchanges heat between the primary and secondary coolant. Additional components (not shown in this figure) may include heat sinks, cold plates and/or heat pipes.

The pumps 30 may be positioned or configured to direct the primary coolant over the high temperature or heat generating components 60. This configuration may be customised for different motherboards 40 or heat generating components 60. Different pump configurations, sizes and quantities may be used.

The primary coolant is sucked or drawn into the heat exchanger 20 from its aperture 120. The primary coolant is at its hottest temperature at this point. The primary coolant cools as it is sucked or flows down the heat exchanger channel.

Figure 5:
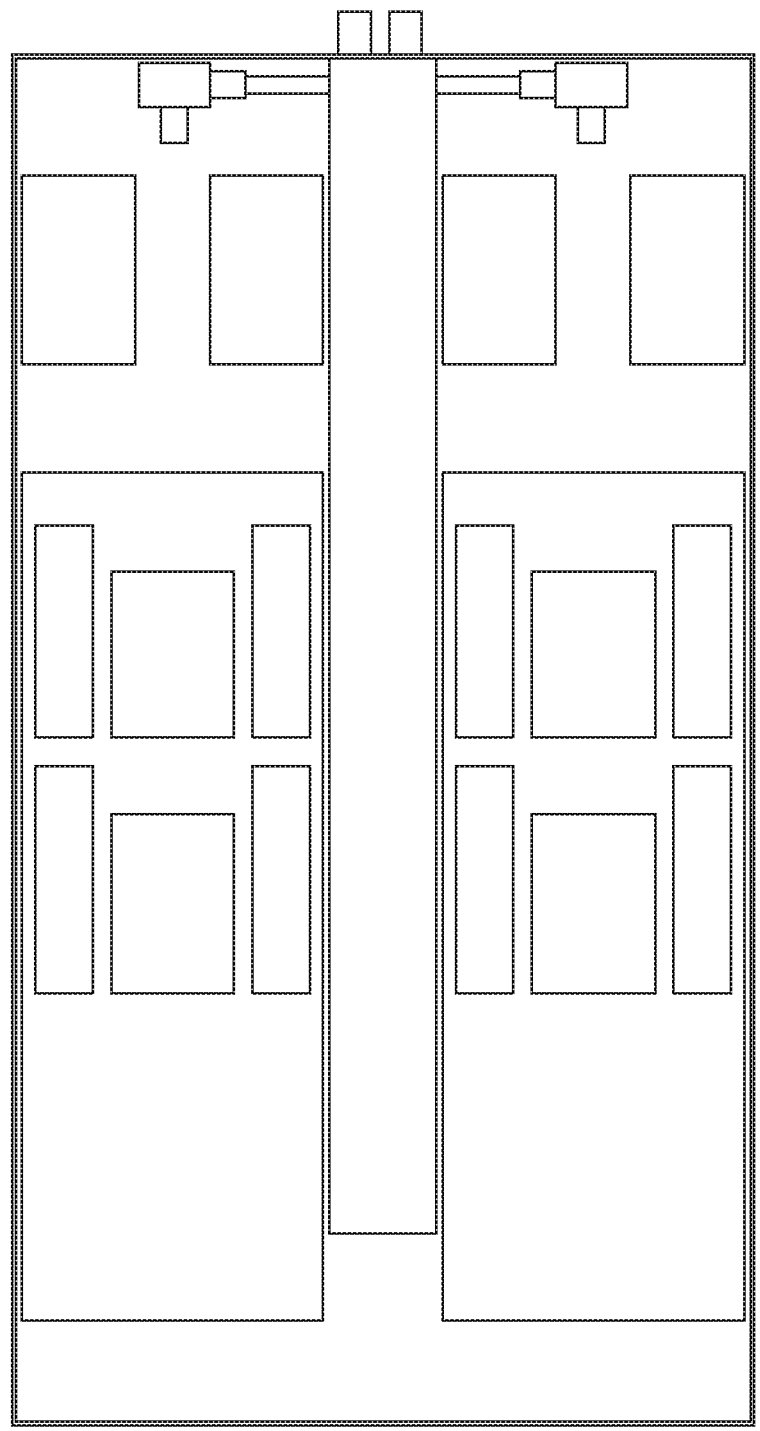
FIG. 5 shows a schematic diagram in plan view of the cooling system of FIG. 1.

FIG. 5 shows a plan view in schematic form of the various components of the cooling system 5. This view shows the channel of the heat exchanger 20 extending down the centre of the tank 10, with the aperture located towards but not reaching the end of the tank 10 distal to its rear end. The pumps 30 and nozzles 100 are arranged on either side of the heat sink. In this example, the cooling system 5 is substantially symmetrical along its centre or long axis.

Figure 6:
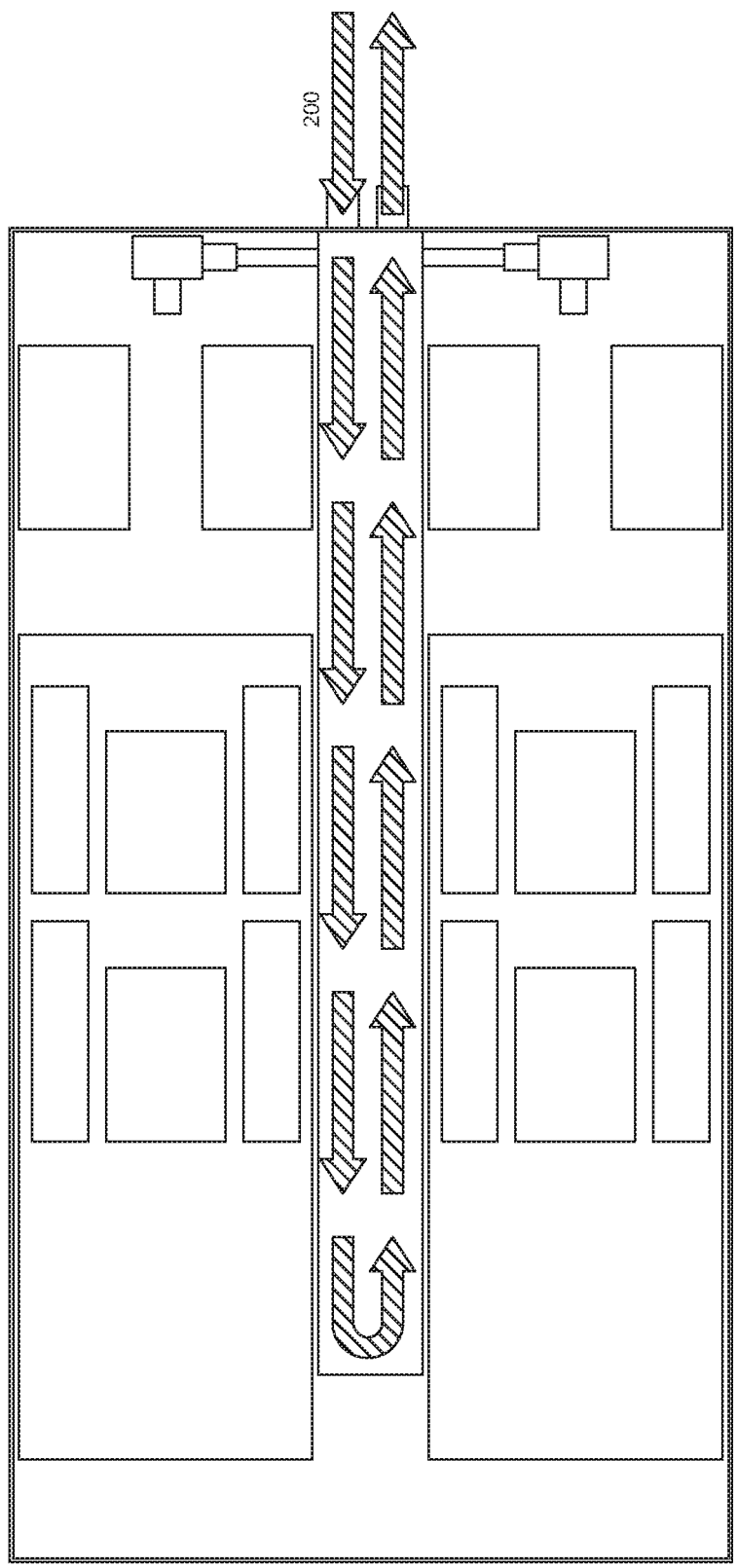
FIG. 6 shows a plan view of the cooling system of FIG. 1, including an indication of the flow of a secondary coolant.

FIG. 6 illustrates schematically the flow 200 of the secondary coolant through the conduit within the heat exchanger 20. The conduit may take the form or a u-tube (e.g. of circular profile or cross section) and so flows substantially parallel with the channel of the heat exchanger 20 from the inlet 70 towards the aperture 120 of the channel where it makes a sharp turn to return back towards the outlet 75. During this passage, the secondary coolant will warm up and remove heat from the primary coolant. Therefore, the secondary coolant will emerge from the outlet 75 at a higher temperature than it enters the inlet 70. The secondary coolant may itself be cooled using passive or active cooling, such as a heat exchanger, heat pump or cooler. Preferably, no active chiller is required as the secondary coolant's volume, flow and external radiation can be configured to return the secondary coolant to the cooling system 5 at a temperature low enough to sufficiently cool the primary coolant (i.e. to avoid thermal damage to the heat generating components 60). The secondary coolant may be shared between multiple tanks 10, which may be configured for flow of the secondary coolant in series, parallel or a combination thereof. An additional pump and controller (or multiple pumps and/or controllers), not shown, may be provided for the flow of the secondary coolant.

Figure 7:
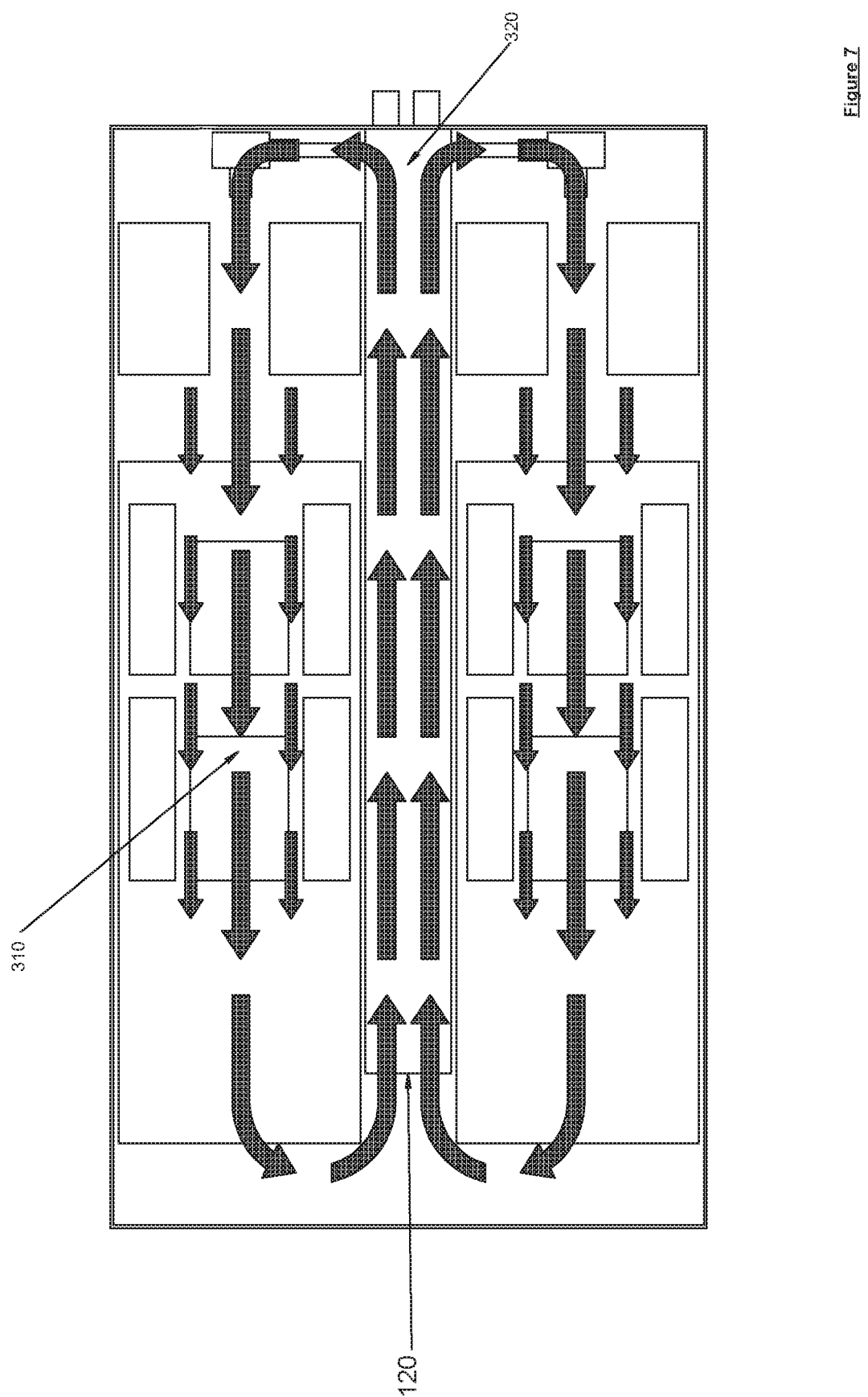
FIG. 7 shows a plan view of the cooling system of FIG. 1, including an indication of the flow of a primary coolant.

FIG. 7 shows the flow 310 of the primary coolant as it circulates the tank 10. The pump (or pumps) 30 draw the primary coolant into the heat exchanger channel where it cools. This is achieved by pushing or forcing the primary coolant out of each pump 30. The primary coolant is at its hottest at the aperture 120. As it passes through the heat exchanger 20 the primary coolant cools and is at its coldest at the point marked 320. Heat has been transferred to the secondary coolant within the heat exchanger 25. The primary coolant is directed out of nozzles 100 in the direction of the heat generating components 60 on the motherboards 40. Arrows 310 indicate the primary coolant passing over and around or spreading over the heat generating components 60, where this heat is picked up and removed by the primary coolant. Where heat sinks or fins are mounted on or close to the heat generating components 60 (or at other locations within the enclosure 10) then the flow of primary coolant from the nozzles 100 may be arranged parallel to any fins on the heat sinks. The cycle repeats with the primary coolant again entering the aperture 120.

The system may be configured to allow single phase (i.e. liquid) immersion cooling of the electrical components and any components mounted within the enclosure. Heat is removed from the vicinity of the heat generating electrical components generally by conduction but also by convection. In some circumstances, the cooling module may be configured to allow two-phase cooling. In two-phase cooling, heat generated by the electrical components causes the coolant liquid to boil and evaporate to a vapour or gas, which then condenses (i.e. at the heat exchanger) so as to remove heat from the cooling module.

Various electrical and power connectors may be provided to couple with the components or motherboard or motherboards within the volume of the enclosure. These may include a power plug, socket or other connectors. Power and/or data inputs may be arranged at the wall of the cooling module so as to allow entry of an electrical and/or data connection into the cooling module from external power or data sources. In some cases, these inputs may be arranged at a rear plate or back plate of the cooling module, for instance on the same face as any data connections and or the inlet and outlet of the secondary coolant.

Figure 8A:
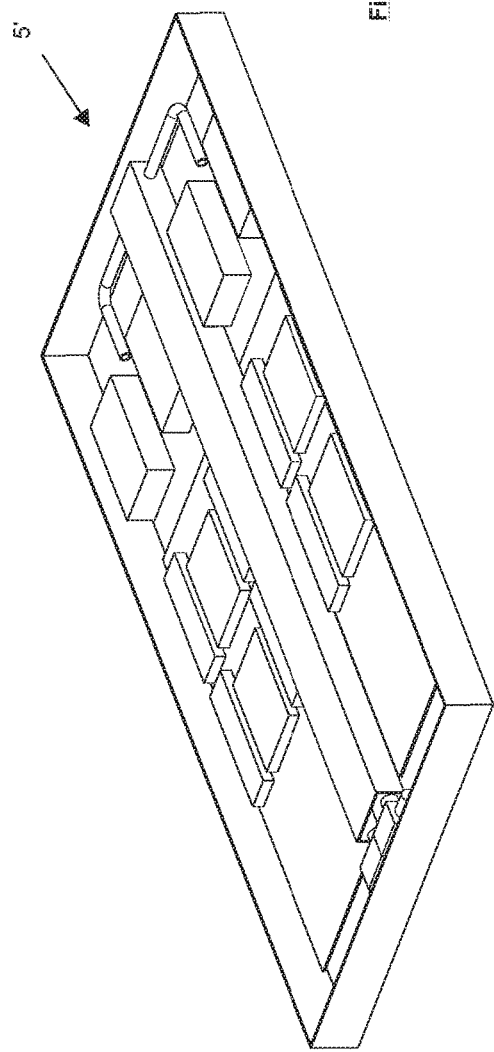
FIG. 8A shows a perspective view of a further example cooling system having an alternative heat exchanger system.
Figure 8B:
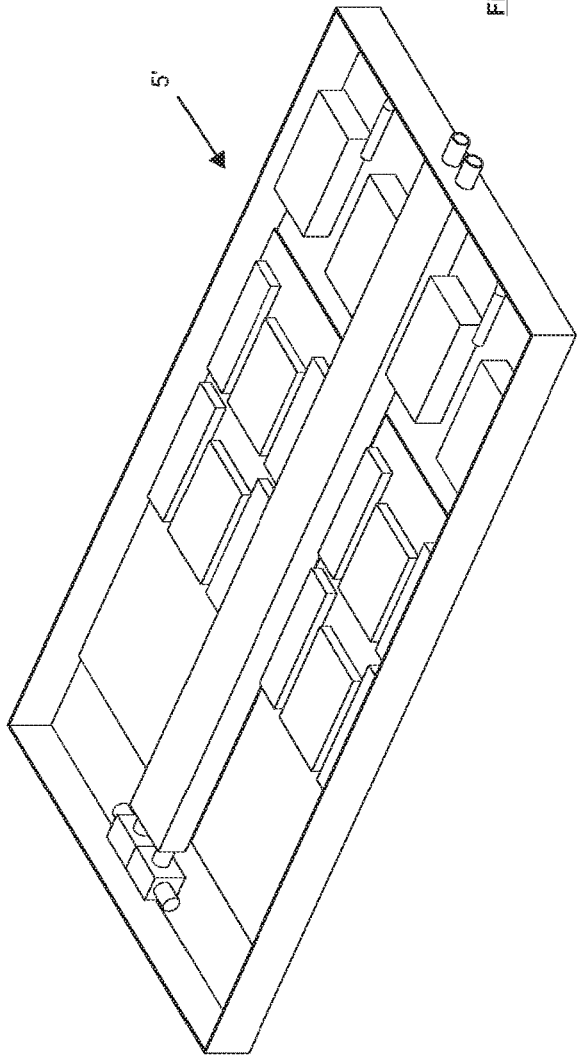
FIG. 8B shows a different perspective view of the further example cooling system.

The pump or pumps may alternatively be located at or close to the aperture 120 (or hotter end) of the channel rather than at the cooler end. FIGS. 8A, 8B, 9, 10 and 11 illustrate this alternative arrangement in more detail. FIGS. 8A and 8B show different perspective views of this arrangement, where the pump or pumps draw or suck the hot primary coolant (i.e. after picking up heat from the heat generating components) into the heat exchanger. This is an alternative to directing the cooled primary coolant out of the heat exchanger and on to the heat generating components causing hotter or hottest primary coolant to be drawn into or sucked into the aperture of the heat exchanger.

Figure 9:
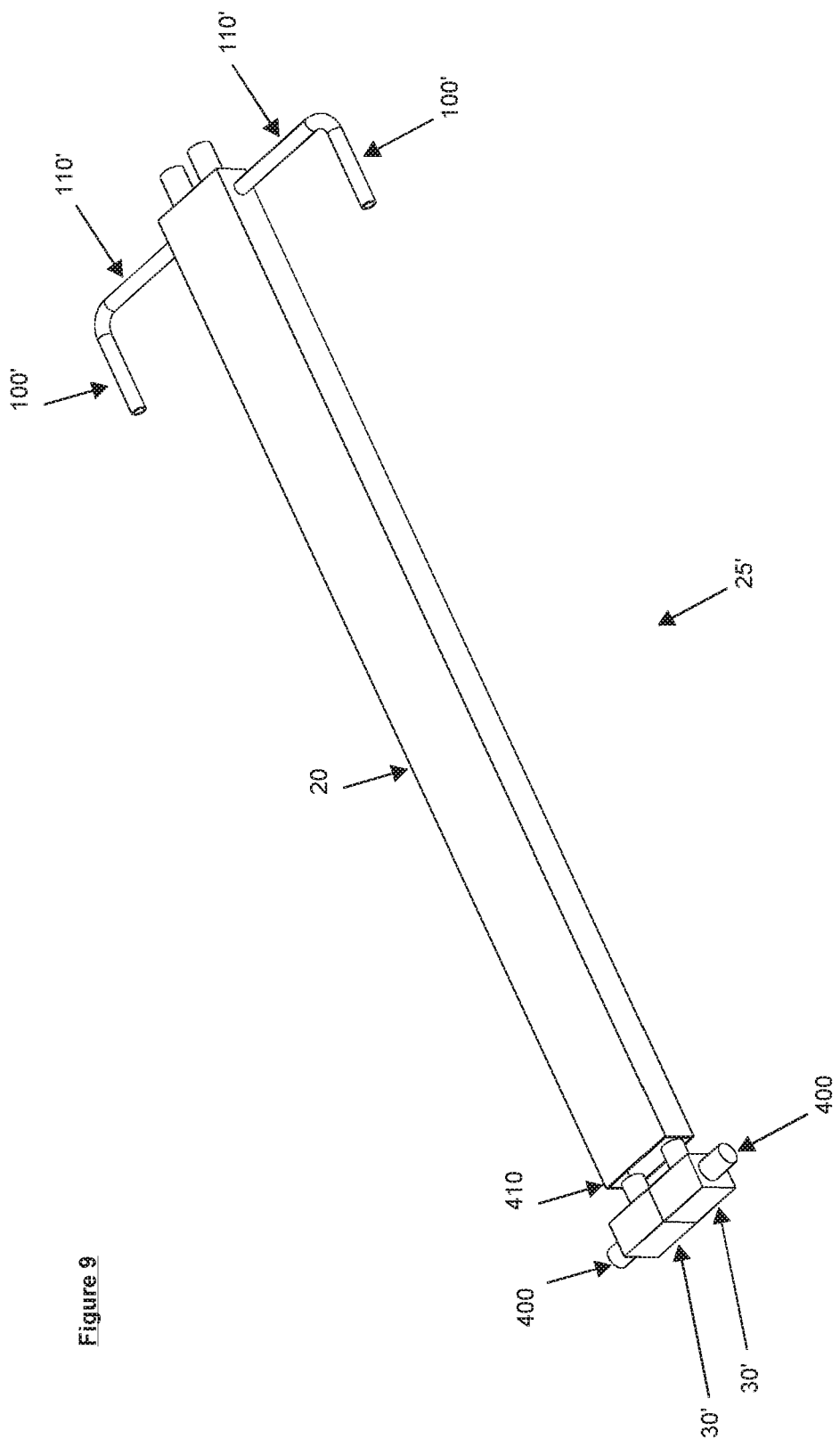
FIG. 9 shows a perspective view of the alternative heat exchanger system of FIGS. 8A and 8B.

FIG. 9 shows a perspective view of an alternative heat exchanger system 25' found within the alternative cooling system 5'. The other components are substantially the same as previously described. In general, the pump or pumps 30' each have a pump inlet 400 configured to draw the primary coolant into the heat exchanger channel 20. In this arrangement, rather than an aperture open to the volume holding the primary coolant, the channel 20 is attached to an outlet or outlets of a pump or pumps 30' to form a sealed coupling 410. FIG. 9 shows this sealed coupling 410 to be in the form of two pipes or tubes but a single tube (or other arrangement) may be used instead. The pump inlets 400 are shown at right angles to the channel 20 but other angles (including parallel) may be used.

Nozzles 100' direct the primary coolant over the motherboards 40 and any heat generating components 60 are provided in this arrangement. However, these nozzles 100' are no longer required to be attached directly to the pump or pumps 30'. These nozzles 100' are connected to the colder end (in use) of the heat exchanger via connector pipes 110'.

FIG. 10 illustrates schematically the flow of the primary coolant within this alternative arrangement cooling system 25'. The coolant flow is substantially similar to that of the other arrangement (previously described) cooling system 25. A difference is that the primary coolant is pushed around the system 5' by the pump or pumps 30' at a different point in the cycle or flow. FIG. 11 shows a top view of the cooling system 25'. This arrangement uses a similar flow, control and set of components for the secondary coolant as that described previously with the first arrangement.

With this arrangement the pump or pumps 30' are located at the distal end of the tank 10 opposing the rear wall. The primary coolant is therefore pushed through the heat exchanger 20 rather than sucked or drawn through it. This can provide a more effective mechanism. Therefore, the pumps 30' don't direct the flow of the primary coolant onto the motherboards 40 or heat generating components 60 as this is provided indirectly by the nozzles 100'.

A variety of coolant fluids or liquids may be used as the primary and/or secondary coolants. Coolant liquids will be liquid at room temperature. Coolant liquids for single phase immersion cooling will be liquid under normal operating temperatures for the heat generating electrical component. However, those coolants used or sealed within the enclosure for two-phase immersion cooling should evaporate into a gas (i.e. have a boiling point) at normal operating temperatures of the heat generating electrical component, but be liquid at slightly lower temperatures. Examples of suitable coolant liquids (preferably, for the primary coolant) include natural oils, synthetic oils, fluoro-octanes (for instance Fluorinert™), hydrofluoroether, HFE (for instance Novec™), hydrofluorolefin, HFO (for instance Vertrel Sinara™), perfluoroketone, PFK (for instance by Novec™), or perfluoropolyether, PFPE (for instance Solvay Galden™). However, this list is not exhaustive, and other coolant liquids may be used within the present invention.

The enclosure may be formed from any suitable material including but not limited to metal, steel and/or aluminium.

As will be appreciated by the skilled person, details of the above embodiment may be varied without departing from the scope of the present invention, as defined by the appended claims.

For example, a different number of pumps may be used. In use the enclosure has been described as operating horizontally but other configurations (e.g. vertical) may be used. Whilst the conduit in which the secondary coolant flows has been described as a u-tube, other configurations and flows may be used. Furthermore, different heat exchanger system configurations may be used.

Further drawings, as described below, illustrate various aspects and features of a cooling system 5" according to a second embodiment that may be used with one or more heat generating components. The details of the cooling system 5" shown in FIGS. 12 to 17 are similar, but vary slightly from those shown with respect to the cooling systems 5 and 5' shown in FIGS. 1 to 11. Where the same components as used in the first embodiment are shown, identical reference numerals have been indicated. A variation in the positioning and/or arrangement of the component has been indicated by a mark after the reference numeral, for example with reference to cooling system 5". An understanding of most of this embodiment can be gained from the explanation provided above with reference to FIGS. 1 to 11. The skilled person will understand that, where compatible, the features described with reference to other embodiments may also be applied to the cooling system 5" shown in FIGS. 12 to 17.

Figure 12:
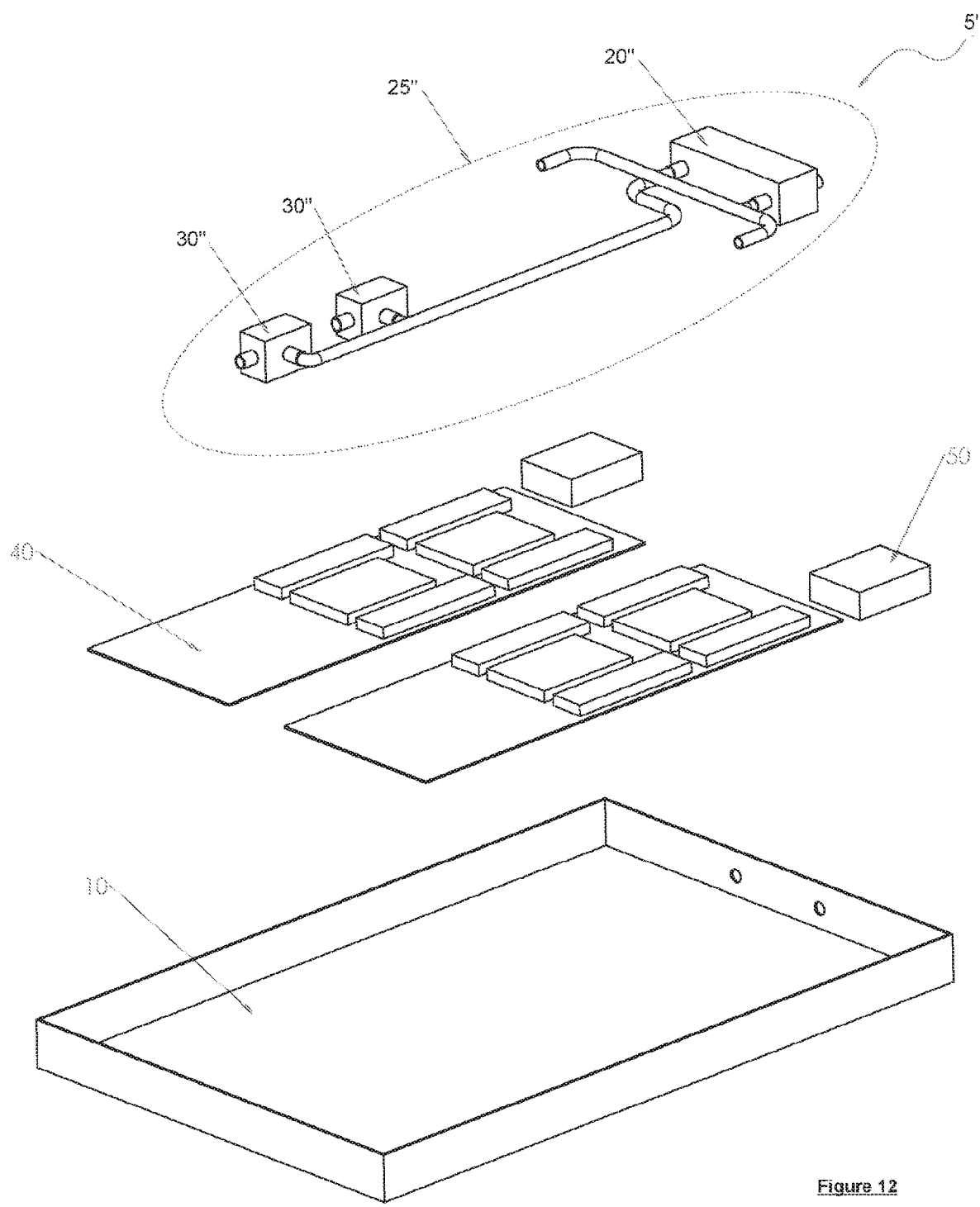
FIG. 12 shows an exploded view of an example cooling system for heat generating components according to a second embodiment, the cooling system including a heat exchanger system.

FIG. 12 shows an exploded view of some of the components of the cooling system 5". This is generally similar to that shown in FIG. 1, but with some changes to the layout of a heat exchanger 20" and a pair of pumps 30". Dotted line 25" encloses a set of components that both cool and circulate the first coolant in this second embodiment. The heat exchanger 20" is located at an edge of the tank 10 and provides the conduit (not shown, as it is within the heat exchanger 20") through which the secondary coolant is arranged to flow. The pumps 30" are configured to draw the primary coolant through the heat exchanger 20", particularly though a channel within the heat exchanger 20" that is proximal to the conduit in which the secondary coolant is arranged to flow, such that heat is transferred from the channel to the conduit) and around the tank 10. The secondary coolant conduit therefore provides a fluid-tight seal between the primary coolant and the secondary coolant. This is especially effective when the primary coolant enters the heat exchanger 20" and surrounds the secondary coolant conduit.

Figure 13:
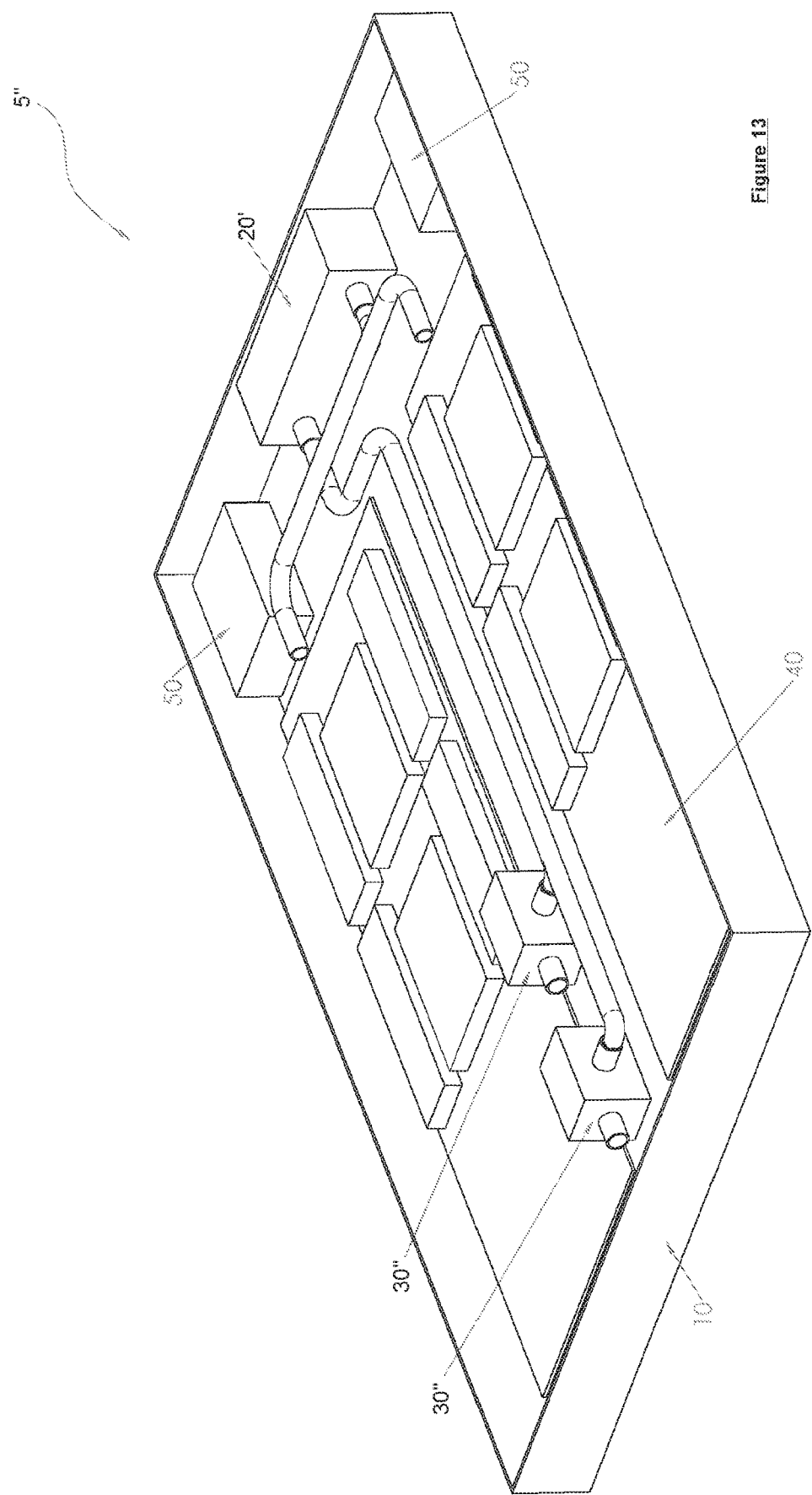
FIG. 13 shows a perspective view of the cooling system of FIG. 12.
Figure 14:
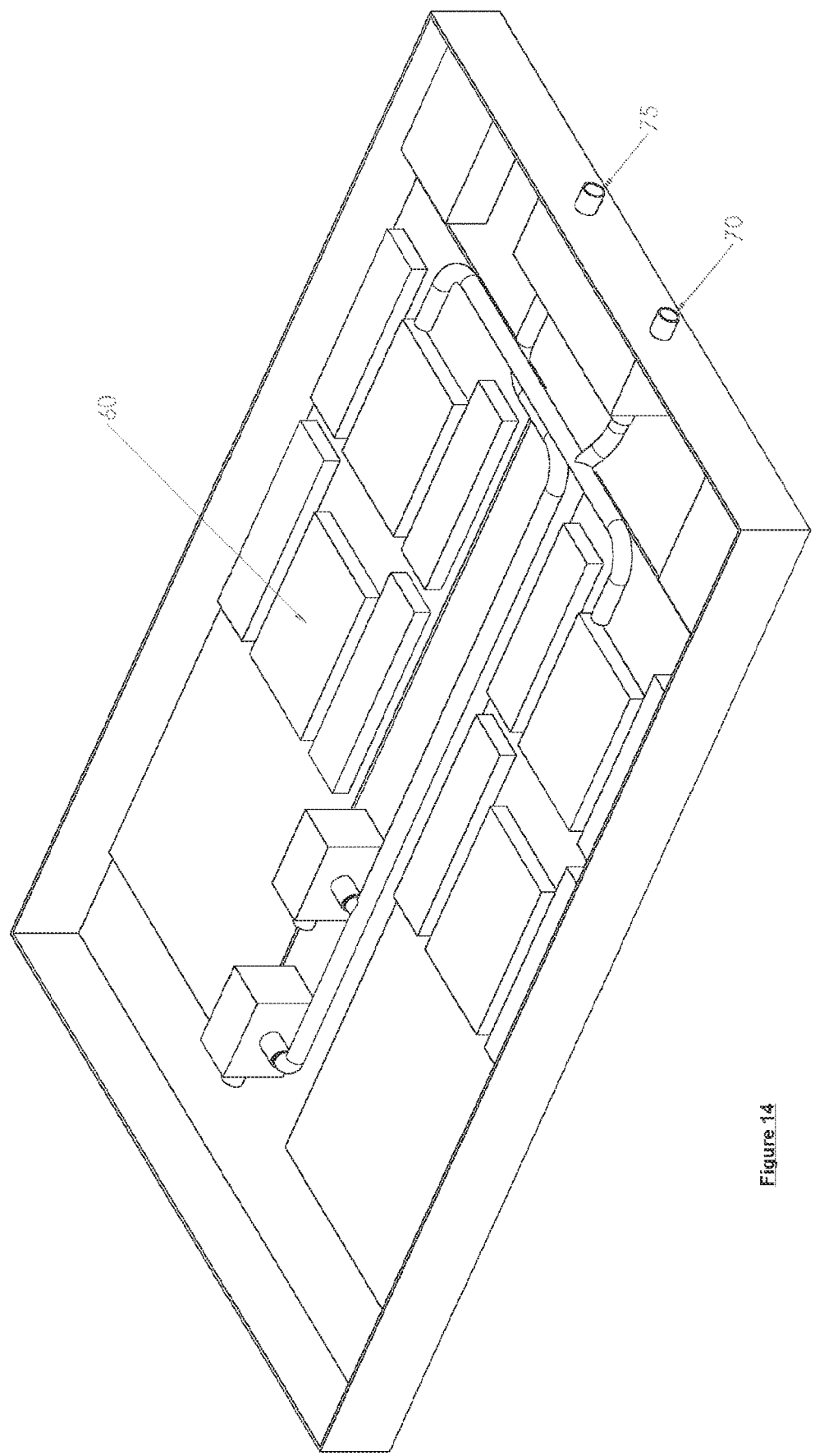
FIG. 14 shows a further perspective view of the cooling system of FIG. 12 rotated by 90 degrees.

FIG. 13 shows a schematic diagram of the same components of the cooling system 5" shown in FIG. 12 but located in assembled form within the tank 10. It will be seen from this drawing that the location of other components 50 (typically power supplies) may be adjusted in comparison with the first embodiment, in view of the change of layout. FIG. 14 shows the cooling system 5", rotated by 90 degrees.

Figure 15:
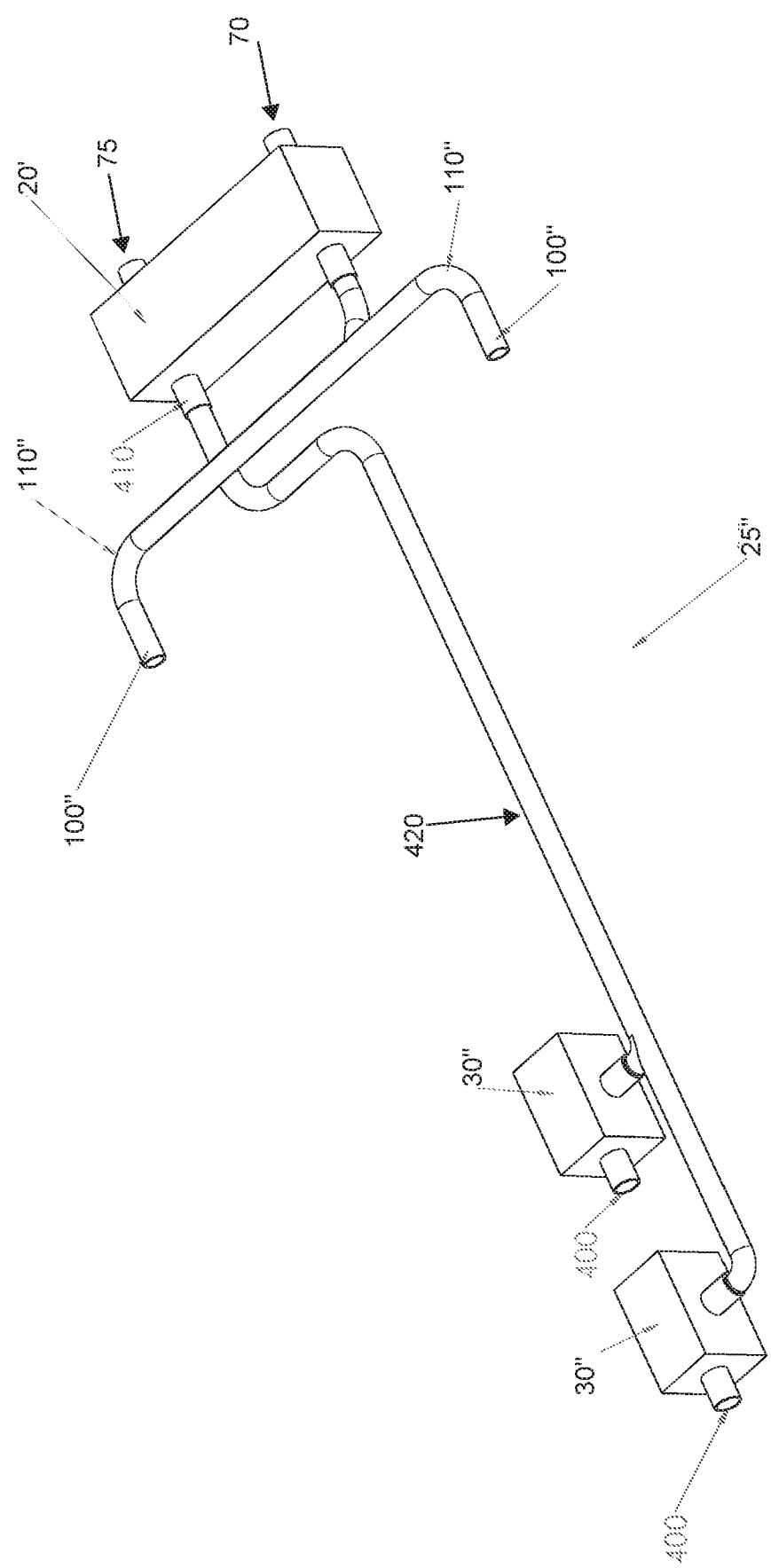
FIG. 15 shows a perspective view of the heat exchanger of the cooling system of FIG. 12.
Figure 16:
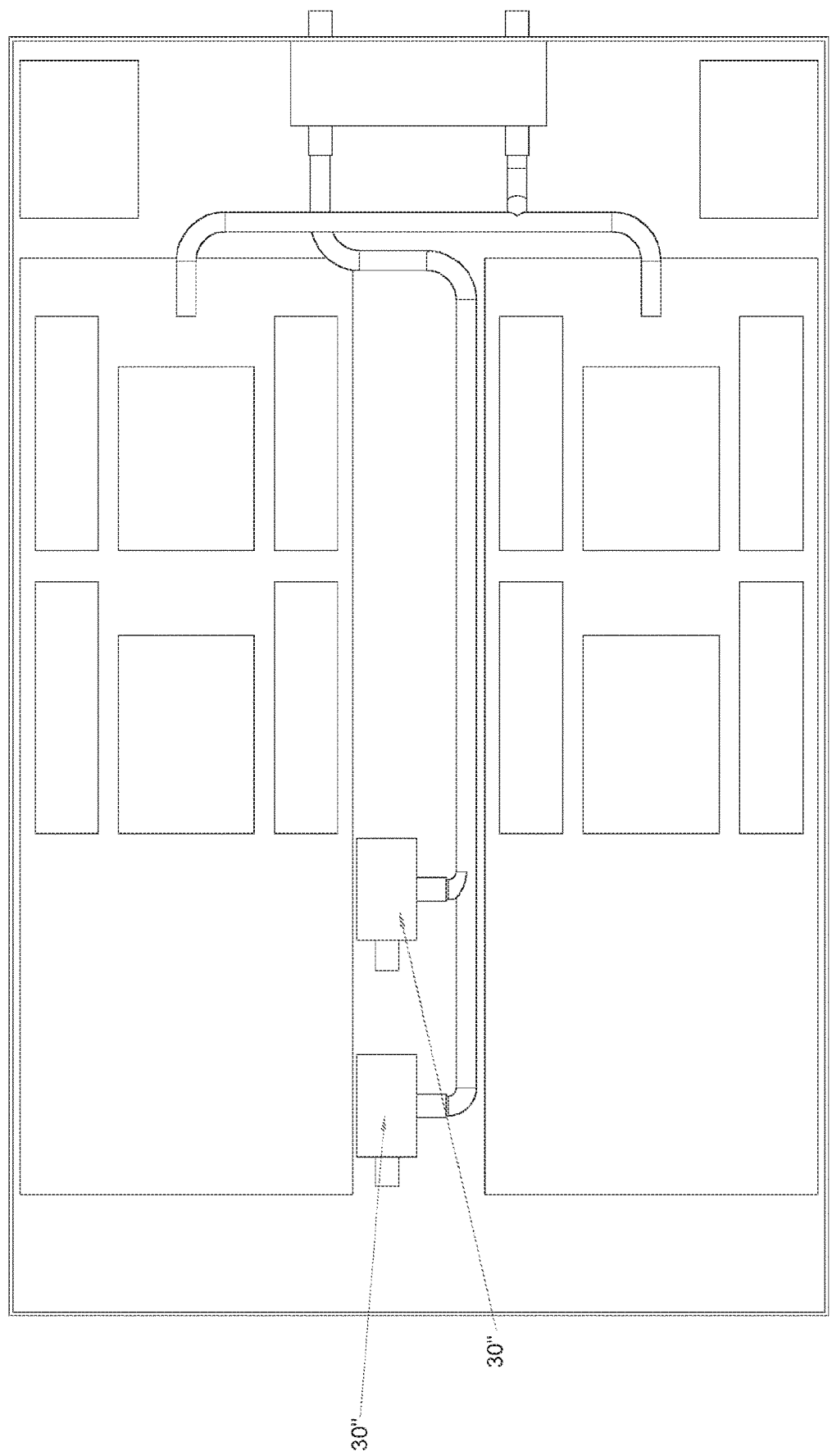
FIG. 16 shows a schematic diagram in plan view of the cooling system of FIG. 12.

FIG. 15 shows in greater detail the set of components or heat exchanger system 25" that both cools and circulates the first coolant in this embodiment (which is in fact more similar to the variant shown in FIG. 9 than that depicted in FIG. 4). Pumps 30" draw, direct or suck the primary coolant in to the heat exchanger 20" through respective pump inlets 400 at each pump 30". The primary coolant is at its hottest temperature at this point. The primary coolant flows along a pipe or duct 420 to the heat exchanger 20" throughout inlet 410. The primary coolant is cooled within the heat exchanger 20" and then flows along connector or pump pipes 110", which release the primary coolant through nozzles 100". The primary coolant is pumped out of nozzles 100" towards the heat generating components (not shown in this figure). FIG. 16 shows a plan view in schematic form of the various components of the cooling system 5". Other configurations of the pumps 30", duct 420, heat exchanger 20" and outlets 100" are possible.

Figure 17:
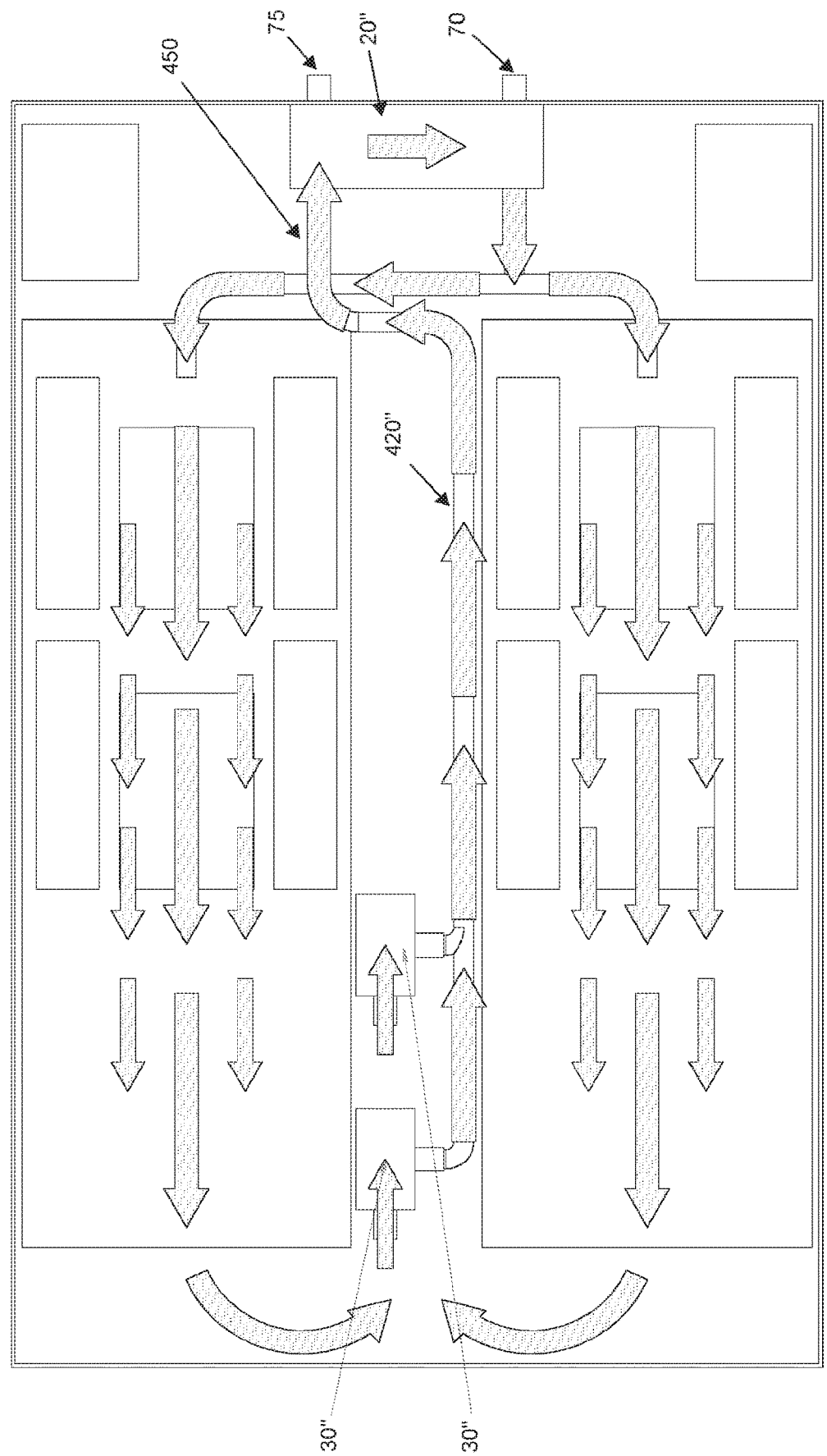
FIG. 17 shows a plan view of the cooling system of FIG. 12, including an indication of the flow of a secondary coolant.

FIG. 17 illustrates schematically the flow 450 of the primary coolant through the pumps 30", duct 420, heat exchanger 20" and within the tank 10. This differs slightly from FIG. 6, which shows the flow of the secondary coolant. The primary coolant is drawn through the pumps 30" into the duct 420", until it reaches the heat exchanger 20". There, the heat carried by the primary coolant is transferred to the secondary coolant. The cooled primary coolant is pumped out and passes over the heat generating components to receive further heat, until being drawn back through the pumps 30".

Many combinations, modifications, or alterations to the features of the above embodiments will be readily apparent to the skilled person and are intended to form part of the invention. Any of the features described specifically relating to one embodiment or example may be used in any other embodiment by making the appropriate changes.

The invention claimed is:

1. An apparatus for cooling one or more heat generating components, the apparatus comprising:
    an enclosure defining a volume containing: a first liquid coolant, and the one or more heat generating components immersed in the first liquid coolant;
    a heat exchanger unit comprising a conduit surrounded by the volume, the conduit enabling a second liquid coolant to enter and leave the enclosure, the conduit providing a fluid-tight seal between the first liquid coolant and the second liquid coolant when the first liquid coolant within the volume surrounds the conduit; and
    a pump within the enclosure configured to direct the first liquid coolant horizontally:
        over a plurality of hot areas that form from the one or more heat generating components, such that heat is exchanged from the one or more heat generating components to the first liquid coolant, and
        via a pipe or duct disposed entirely within the enclosure to or from the heat exchanger unit such that the heat is exchanged between the first liquid coolant and the second liquid coolant.

2. The apparatus according to claim 1, wherein the heat exchanger unit further comprises a channel arranged proximal to the conduit, the channel having an inlet for receiving the first liquid coolant into the channel and an outlet for expelling the first liquid coolant from the channel after exchanging the heat with the second liquid coolant.

3. The apparatus of claim 2, wherein the conduit is located within the channel.

4. The apparatus of claim 2, wherein the channel has a box profile.

5. The apparatus according to claim 2, wherein the pump is in fluid communication with the inlet to the channel or the outlet of the channel.

6. The apparatus according to claim 1, wherein the pump is configured to direct the first liquid coolant parallel to the flow of the second liquid coolant within the conduit.

7. The apparatus according to claim 1, wherein the conduit is u-shaped.

8. The apparatus according to claim 1, wherein the enclosure further comprises an inlet and an outlet for the second liquid coolant.

9. The apparatus of claim 8, wherein the inlet and the outlet for the second liquid coolant are adjacent to each other.

10. The apparatus of claim 8, wherein the inlet and the outlet for the second liquid coolant are located adjacent to the pump.

11. The apparatus of claim 8, wherein the inlet and the outlet for the second liquid coolant are located adjacent to the conduit.

12. The apparatus according to claim 1, further comprising one or more heat sinks in heat communication with the one or more heat generating components.

13. The apparatus of claim 12, wherein the one or more heat sinks have fins arranged parallel to a flow of the first liquid coolant.

14. The apparatus according to claim 1, wherein the enclosure is further arranged to house one or more power supplies within the volume.

15. The apparatus according to claim 1, further comprising a second pump.

16. The apparatus of claim 15, wherein the pump is a first pump, the first pump and the second pump are arranged on opposing sides of the conduit.

17. The apparatus of claim 1, wherein the pump directs the first liquid coolant via the pipe or duct from the heat exchanger unit; the apparatus further comprising an additional pipe configured to direct the first liquid coolant to the heat exchanger unit.

18. The apparatus of claim 17, wherein the heat exchanger unit further comprises a housing surrounding the conduit, the housing having an inlet for first liquid coolant to flow through the heat exchanger unit.

19. The apparatus of claim 17, wherein the heat exchanger unit is positioned at an edge of the volume within the enclosure.

20. The apparatus according to claim 1, wherein the first liquid coolant is a one phase coolant.

21. The apparatus according to claim 20, wherein the apparatus is configured to maintain the first liquid coolant in only a liquid phase.

22. The apparatus according to claim 1, wherein the second liquid coolant is water or water-based.

23. The apparatus according to claim 1, wherein the volume of the enclosure is defined by a container housing the first liquid coolant and the one or more heat generating components, the enclosure being arranged so as to prevent the first liquid coolant from leaving the container once the enclosure is sealed.

24. The apparatus according to claim 1, wherein the heat exchanger unit is disposed between at least two electrical components within the enclosure, each of the at least two electrical components being a power supply, one of the one or more heat generating components, or both.

* * * * *